(12) United States Patent
Suzuki et al.

(10) Patent No.: US 8,573,149 B2
(45) Date of Patent: Nov. 5, 2013

(54) FILM DEPOSITION APPARATUS FOR MAGNETIC RECORDING MEDIUM

(71) Applicant: Fuji Electric Co., Ltd., Kawasaki (JP)

(72) Inventors: Katsunori Suzuki, Nagano (JP); Takeshi Watanabe, Nagano (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/858,386

(22) Filed: Apr. 8, 2013

(65) Prior Publication Data

US 2013/0213302 A1 Aug. 22, 2013

Related U.S. Application Data

(62) Division of application No. 12/453,633, filed on May 18, 2009, now Pat. No. 8,440,269.

(30) Foreign Application Priority Data

May 20, 2008 (JP) ................................. 2008-132245

(51) Int. Cl.
*C23C 16/00* (2006.01)
*C23C 16/44* (2006.01)
*C23C 16/50* (2006.01)
*C23C 16/513* (2006.01)

(52) U.S. Cl.
USPC ........... 118/665; 118/663; 118/715; 118/722; 118/723 R

(58) Field of Classification Search
None
See application file for complete search history.

(56) References Cited

U.S. PATENT DOCUMENTS

| 5,342,660 | A | * | 8/1994 | Cann et al. | 427/577 |
| 6,173,672 | B1 | * | 1/2001 | Shepard, Jr. | 118/723 R |
| 2006/0159844 | A1 | * | 7/2006 | Moriwaki et al. | 427/127 |
| 2007/0077365 | A1 | * | 4/2007 | Nakayama et al. | 427/497 |
| 2007/0134436 | A1 | * | 6/2007 | Kolpakov et al. | 427/532 |
| 2007/0291410 | A1 | * | 12/2007 | Oka | 360/126 |

* cited by examiner

*Primary Examiner* — Dah-Wei Yuan
*Assistant Examiner* — Jethro Pence
(74) *Attorney, Agent, or Firm* — Manabu Kanesaka

(57) ABSTRACT

An apparatus for depositing a ta-C thin film for a magnetic recording medium includes a film deposition chamber; a plasma beam formation portion for supplying a plasma beam to the film deposition chamber to form the ta-C thin film on a substrate with a magnetic recording layer thereon; a substrate holder rotatably arranged in the film deposition chamber; a tilting member for continuously changing an inclination angle of the plasma beam to a surface of the magnetic recording layer; and a rotating member for rotating the substrate about a rotation axis of the substrate holder. A control member rotates the substrate holder with the substrate thereon and operates the tilting member to continuously change the inclination angle from a minimum inclination angle to a maximum inclination angle according to an increase in film thickness of the ta-C thin film being formed by the plasma beam formation portion.

4 Claims, 8 Drawing Sheets

Fig. 7

|  | FILM DEPOSITION METHOD | ION BEAM INCLINATION ANGLE | ROTATIONS (PER FILM DEPOSITION TIME) |
|---|---|---|---|
| EMBODIMENT 1 | FCVA | 0 → 80° | 3 |
| EMBODIMENT 2 | FCVA | 0 → 80° | 6 |
| COMPARATIVE EXAMPLE 1 | FCVA | 0 → 80° | 1 |
| COMPARATIVE EXAMPLE 2 | FCVA | 0° | 3 |
| COMPARATIVE EXAMPLE 3 | FCVA | 45° | 0 |
| COMPARATIVE EXAMPLE 4 | FCVA | 0° | 0 |
| COMPARATIVE EXAMPLE 5 | FCVA | 0 ↔ 80° (CHANGED PERIODICALLY, 2 CYCLES) | 3 |
| COMPARATIVE EXAMPLE 6 | FCVA | 0 → 80° | 3 |
| COMPARATIVE EXAMPLE 7 | CVD | 0° | 0 |

Fig. 8

EXPERIMENTAL RESULTS FOR EMBODIMENTS 1 AND 2,

COMPARATIVE EXAMPLES 1 THROUGH 7

|  | PROTECTIVE FILM COVERAGE EVALUATION RESULT ($\mu g/m^2$) | FRICTION FORCE (gf) | Hc (Oe) | NUMBER OF GH ERRORS (PER SURFACE) |
|---|---|---|---|---|
| EMBODIMENT 1 | 0.5 | 0.3 | 3250 | 3.0 |
| EMBODIMENT 2 | 0.3 | 0.3 | 3240 | 2.8 |
| COMPARATIVE EXAMPLE 1 | 5.0 | 0.7 | 3260 | -- |
| COMPARATIVE EXAMPLE 2 | 16 | -- | 3050 | -- |
| COMPARATIVE EXAMPLE 3 | 20 | -- | 3090 | -- |
| COMPARATIVE EXAMPLE 4 | 12 | -- | 3020 | -- |
| COMPARATIVE EXAMPLE 5 | 2.2 | 0.5 | 3040 | 34 |
| COMPARATIVE EXAMPLE 6 | 0.5 | -- | 3255 | 330 |
| COMPARATIVE EXAMPLE 7 | 0.6 | 1.1 | 3240 | 2.3 |

FILM DEPOSITION APPARATUS FOR MAGNETIC RECORDING MEDIUM

CROSS-REFERENCE TO RELATED APPLICATION

This is a divisional application of Ser. No. 12/453,633 filed on May 19, 2009, which claims a priority of Japanese Patent Application No. 2008-132245 filed on May 20, 2008, the entire content of which is incorporated herein.

BACKGROUND OF THE INVENTION AND RELATED ART STATEMENT

The invention relates to a film deposition apparatus for a magnetic recording medium.

In recent years, the hard disk devices which are external storage devices in computers, image record/playback devices, and other equipment have a trend to have higher recording densities and smaller sizes. As a development in these devices, it has a demand for higher recording densities and smaller sizes for the purpose of the magnetic recording medium mounted in hard disk devices as well.

In order to enhance the recording density of a magnetic recording medium, the distance between the magnetic head and the magnetic layer of the magnetic recording medium (hereafter also called the magnetic spacing) must be reduced. In order to make the magnetic spacing smaller and lower the magnetic head flying height, the protective layer which is the uppermost surface formed on the magnetic layer of the magnetic recording medium must be thin. In addition, it is necessary that the film properties and step coverage of the protective layer be satisfactory.

In order to make the protective layer thinner, improvement in the durability and corrosion resistance of the thin film per unit film thickness is indispensable. Such a protective layer can, for example, be formed by using a sputtering method, CVD method, ion beam evaporation deposition method, or other methods.

Further, in a magnetic head, as described in Japanese Unexamined Patent Application Publication No. 2002-212713 (Patent Document 2), a formation of a tetrahedral amorphous carbon (ta-C) protective layer as a hard amorphous carbon film has been proposed. It has been proposed that such a protective layer can be formed by, for example, a FCVA (Filtered Cathodic Vacuum Arc) method (hereafter also called the FCVA method), as disclosed in Japanese Unexamined Patent Application Publication No. 2007-26506 (Patent Document 1), Patent Document 2, and National Publication of Translated Version No. 2007-501331 (Patent Document 3). It has been found that films obtained by the FCVA method have a low ratio of graphite components to diamond components, as well as excellent corrosion resistance and wear resistance.

However, while the FCVA method is maximally effective for attaining good film properties in the case of samples having extremely little surface roughness, step coverage is sometimes poor compared with the CVD method for magnetic recording media having relatively large relief patterns (pit series) on the surface. As a result, there are concerns that this method cannot be applied to discrete track media (DTM), which is regarded as a next-generation hard disk technology enabling high recording densities, or to magnetic recording media for patterned-media methods with relatively large surface relief patterns.

In the FCVA method, as means of enhancing the thin film adhesive strength, it has been proposed that the substrate on which the thin film is formed such that a direction of the substrate normal is inclined at a prescribed inclination angle $\alpha$ with respect to the direction of incidence of a plasma beam, and that the substrate is rotated, as described in Patent Document 2. When using this method, films deposited with this inclination angle $\alpha$ fixed at a constant angle in a range from 10° to 80° have poor step coverage as protective layers when the inclination angle is low, whereas when deposited at a high inclination angle, it is possible that damage to the magnetic layer already formed directly below the protective layer, such as the intrusion of carbon between crystal grains or destruction of crystals, cannot be avoided. That is, it is difficult to attain the improved step coverage and also reduce the damage to the magnetic layer.

Further, as another means of enhancing the thin film adhesive strength, it has been proposed that the incidence angle (inclination angle) relative to the substrate surface of the carbon plasma flow be fixed at each of a plurality of prescribed angles selected in a range from 15° to 45° during a carbon film formation to deposit the film, as described in Patent Document 3. However, when changing the inclination angle in stages without corresponding to the film thickness of the protective layer, it is difficult to achieve both improved step coverage and reduced damage to the magnetic layer.

In light of the above problems, this invention has as an object to obtain a method for depositing a thin film for a magnetic recording medium by using a vacuum evaporation deposition method and a film deposition apparatus using the same. The method for depositing a thin film for a magnetic recording medium is capable of depositing a thin film for a magnetic recording medium by the FCVA method having excellent step coverage, corrosion resistance, and wear resistance, even when deposited on a magnetic recording medium on the surface of which a comparatively large relief pattern is formed, as well as a film deposition apparatus using this method.

Further objects and advantages of the invention will be apparent from the following description of the invention.

SUMMARY OF THE INVENTION

In order to attain the above object, a method for depositing a thin film for a magnetic recording medium of this invention comprises placing a substrate for a recording medium on which a magnetic recording layer has been formed on a substrate holder which is rotatably arranged within a film deposition chamber to which a plasma beam is supplied from a plasma beam formation portion, and continuously changing an inclination angle, formed by the normal to the surface of the magnetic recording layer on the substrate and a plane orthogonal to the direction of incidence of the plasma beam, from a minimum inclination angle to a maximum inclination angle, according to the increase in film thickness of a ta-C thin film formed on the surface of the magnetic recording layer.

Further, a film deposition apparatus of this invention comprises a film deposition chamber, to which a plasma beam is supplied from a plasma beam formation portion; a substrate holder rotatably arranged in the film deposition chamber and removably holding a substrate for a magnetic recording medium on which a magnetic recording layer has been formed; a tilt mechanism portion for continuously changing an inclination angle formed by the normal to the surface of the magnetic recording layer of the substrate held by the substrate holder and a plane orthogonal to the direction of incidence of the plasma beam; a rotation mechanism portion for rotating the substrate for the magnetic recording medium held by the substrate holder around a rotation axis of the substrate holder;

and a control portion for operating the tilt mechanism portion to continuously change the inclination angle from a minimum inclination angle to a maximum inclination angle according to the increase in film thickness of a ta-C thin film formed on the surface of the magnetic recording layer of the substrate for the magnetic recording medium, while operating the rotation mechanism portion to rotate the substrate holder.

As is clear from the above explanation, according to the method for depositing the thin film for the magnetic recording medium and the film deposition apparatus using the same in the present invention, during film deposition, the inclination angle made by the normal to the surface of the magnetic recording layer of the substrate for the recording medium and the plane orthogonal to the direction of incidence of the plasma beam is changed continuously from the minimum inclination angle to the maximum inclination angle, according to the increase in film thickness of the ta-C thin film formed on the surface of the magnetic recording layer. Therefore, the thin film for a magnetic recording medium can be formed by the FCVA method with excellent step coverage, corrosion resistance, and wear resistance, even when formed on a magnetic recording layer in which a relatively large surface relief pattern is formed.

BRIEF DESCRIPTION OF THE DRAWINGS

FIG. 7 is a table showing film deposition conditions in each of the embodiments of the method for depositing the thin film for the magnetic recording medium of the invention, and in each of the comparative examples; and FIG. 8 is a table showing evaluation results for the magnetic recording media obtained in each of the embodiments of the method for depositing the thin film for the magnetic recording medium of the invention, and in each of the comparative examples.

DETAILED DESCRIPTION OF PREFERRED EMBODIMENTS

Figure 2:
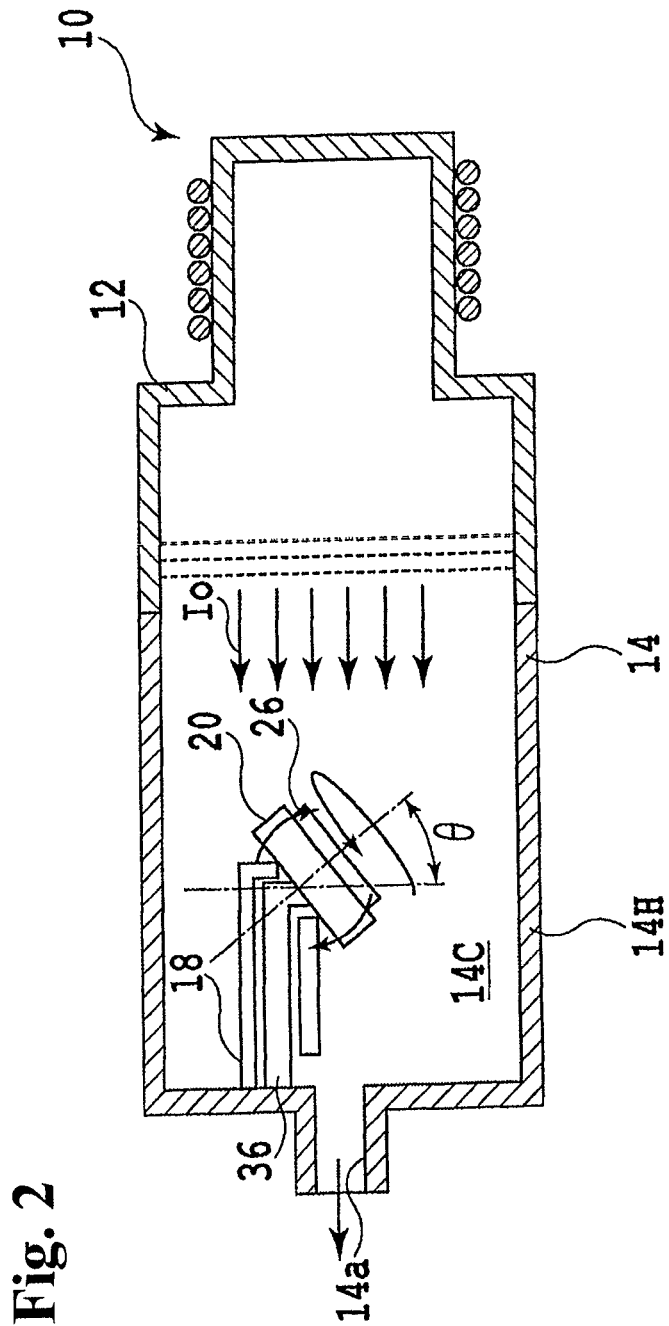
FIG. 2 is a schematic diagram showing the overall configuration of the film deposition apparatus of FIG. 1.

FIG. 2 shows the configuration of a film deposition apparatus to which one example of a method for deposition of a thin film for a magnetic recording medium of this invention is applied.

The apparatus shown in FIG. 2 is a film deposition apparatus which employs a FCVA (Filtered Cathodic Vacuum Arc) method to deposit a protective layer 28Ld on a magnetic recording medium, described below.

Figure 4:
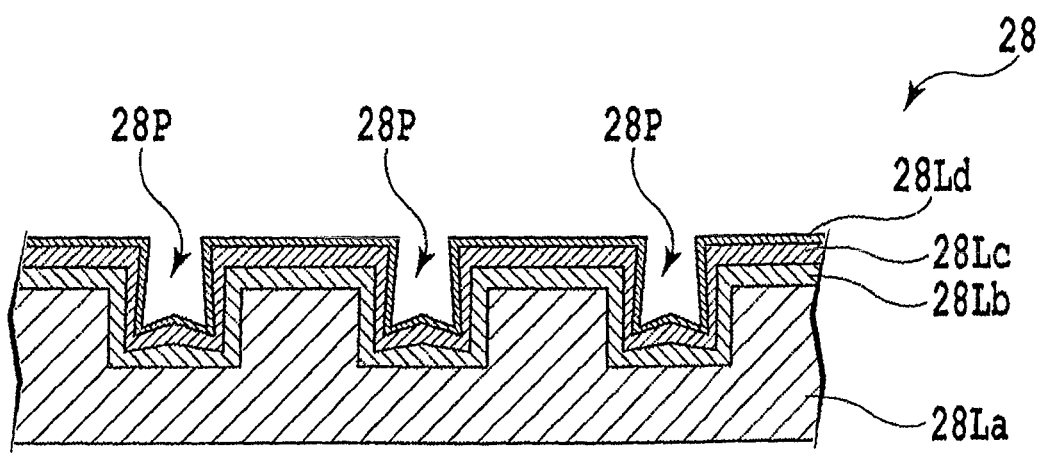
FIG. 4 is a partial cross-sectional view of the magnetic recording medium where the method for depositing a thin film for the magnetic recording medium of this invention is applied.

As shown in a partially enlarged view in FIG. 4, the magnetic recording medium 28 has, for example, discrete tracks 28P concentric on the recording surface and having a discrete track media (DTM) design.

The magnetic recording medium 28 has a substrate 28La, an underlayer 28Lb formed of a Cr alloy of prescribed film thickness on one surface of the substrate 28La, a magnetic layer 28Lc serving as the magnetic recording layer formed on the underlayer 28Lb, and a protective layer 28Ld formed on the magnetic layer 28Lc. The magnetic recording medium 28 has a penetrating hole in the center.

The substrate 28La is, for example, formed in a disc shape, with diameter 95 mm and thickness 1.27 mm, and formed of a highly heat-resistant polyolefin resin (Tg (glass transition point) 140° C.) as a resin material.

In forming the substrate 28La, when, for example, an injection molding apparatus with a maximum injection molding pressure of 70 t, equipped with a stamper in which a die is fixed, is used, as the molding conditions, the resin temperature, injection speed, mold clamping pressure, and fixed side/mobile side die temperature are set to 320° C., 120 mm/s, 90 kg/cm$^2$, and 110° C./110° C., respectively.

The stamper has a circular shape having a relief pattern of width 100 nm and depth 50 nm therein.

The magnetic layer 28Lc is formed of, for example, a Co alloy, Pt, or similar, and has a predetermined thickness.

The protective layer 28Ld is formed of, for example, tetrahedral amorphous carbon (ta-C), as a hard amorphous carbon film (protective film), as a thin film of thickness approximately 3 nm. After fabricating the protective layer 28Ld, a lubricant (Z-Tetraol) manufactured by Solvay Solexis is applied to the surface of the protective layer 28Ld up to a film thickness of 1.0 nm using a dip method.

Hence, after formation of the substrate 28La, the above-described underlayer 28Lb, magnetic layer 28Lc, and protective layer 28Ld are deposited in order, thereby obtaining the magnetic recording medium 28.

As shown in FIG. 2, the film deposition apparatus 10 comprises a plasma beam formation portion 12, comprising a plasma generation portion, magnetic filter portion and beam scanning device, and a vacuum chamber 14 connected to the plasma beam formation portion 12 for guiding the plasma beam Io from the plasma beam formation portion 12 toward the surface of the magnetic layer 28Lc formed on the substrate held by the substrate holder 20.

In the plasma generation portion, a striker (trigger) comprising a carbon rod is used in the arc power supply, and through initiation of arc discharge, arc vaporization of a graphite target (purity 99.999%) which is the cathode occurs. The arc current at this time is, for example, 120 A, and the arc voltage is, for example, set to 30 V. By this means, electrons and carbon ions are generated through arc vaporization. In addition, neutral particles and similar are also generated.

In the magnetic filter portion, the above-described neutral particles and similar are removed by means of an arc-shaped magnetic filter (electromagnetic coil), so that a plasma beam Io comprising only electrons and carbon ions is guided into the vacuum chamber 14 while being deflected and scanned by the beam scanning device. By this means, the plasma beam Io reaches the surface of the magnetic layer 28Lc formed on the substrate 28La. In this way, a carbon film formed only of carbon ions, not containing H, is formed as a fine-textured tetrahedral amorphous carbon (ta-C) film, to serve as the protective layer 28Ld. Control of the arc power supply, bias power supply provided with the magnetic filter portion, and power supply provided with the beam scanning device are controlled by a power supply control portion (not shown in the figure).

The vacuum chamber 14 has an exhaust opening 14a in one end portion of the housing 14H forming the film deposition chamber 14C in the direction receding from the plasma beam formation portion 12. The exhaust opening 14a is connected to a vacuum pump as an evacuation means (not shown). The vacuum pump is controlled by a pump control portion (not shown). By this means, the interior of the film deposition chamber 14C is evacuated by the vacuum pump until the pressure reaches a prescribed pressure.

Figure 3A:
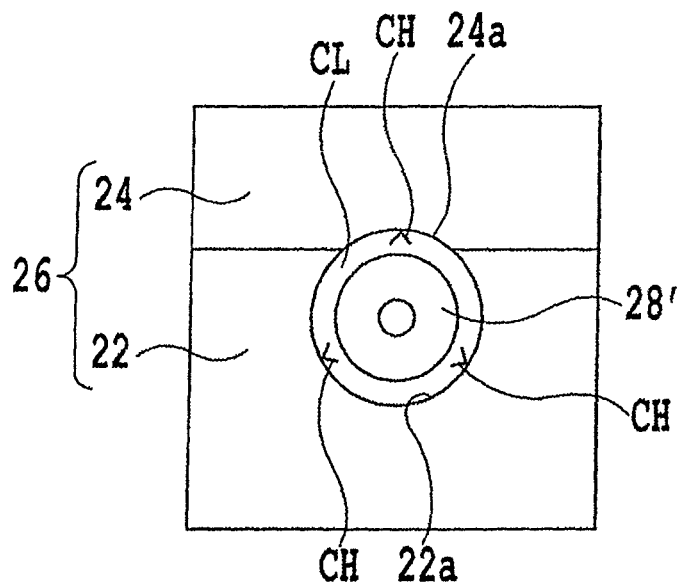
FIG. 3A is a plan view showing a sample substrate chuck together with a substrate for the recording medium.
Figure 3B:
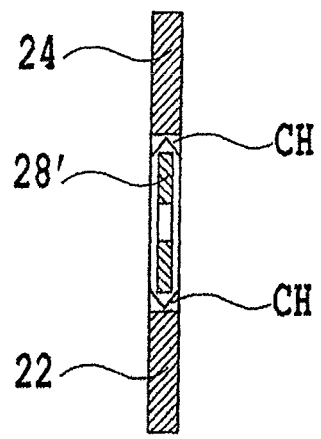
FIG. 3B is a side view of the example shown in FIG. 3A.
Figure 3C:
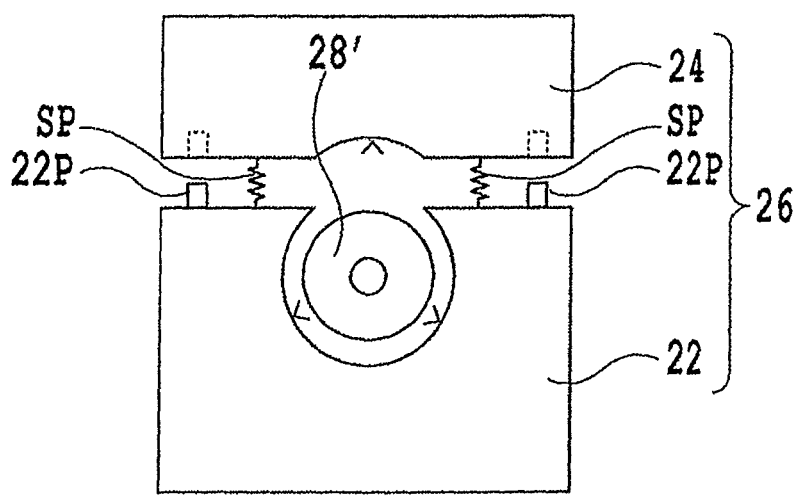
FIG. 3C is a view showing an operation of the sample substrate chuck.

Near the exhaust opening 14a of the film deposition chamber 14C, the substrate holder 20 is positioned so as to be bombarded by the plasma beam Io. The substrate holder 20 detachably holds, via a sample substrate chuck 26 described below, a magnetic recording medium on which no protective layer is formed, as a partly-finished product. The sample substrate chuck 26 comprises as main elements plates 22, 24 which cooperate to form a three-jaw chuck which detachably holds the partly-finished recording medium substrate on which no protective layer 28Ld is formed, as shown in FIGS. 3A, 3B, and 3C. The plate 22 has in the center portion thereof an arc-shape substrate accommodation portion 22a, formed as a cutout in one edge. On the inner circumference portion of the substrate accommodating portion 22a are formed, in two places at a prescribed interval, jaw portions CH which abut against the end face in the circumferential direction of the recording medium substrate 28'. Also, positioning pins 22P, which mate with positioning holes in the plate 24, are provided, at a prescribed interval, in one end face of the plate 22. The plate 24 has an arc-shape substrate accommodating portion 24a formed as a cutout in one edge. In the center portion of the inner circumference portion of the substrate accommodating portion 24a is formed a jaw portion CH which abuts against the end face in the circumferential direction of the recording medium substrate 28'. Springs SP are provided between one end face of the plate 22 and the opposing end face of the plate 24 for impelling the plates 22 and 24 to move apart.

When gripping the recording medium substrate 28' with the sample substrate chuck 26, with the plates 22, 24 moved apart as shown in FIG. 3C, the recording medium substrate 28' is positioned within the substrate accommodating portion 22a of the plate 22 so as to abut against the two jaw portions CH. Then, as shown in FIGS. 3A and 3B, the plate 24 is brought into proximity with the plate 24 against the impelling forces of the springs SP, so that the recording medium substrate 28' is gripped by the three jaw portions CH.

By this means, the magnetic layer 28Lc is made substantially parallel to the flat plate extending to the peripheries of the substrate accommodating portions 22a and 24a in the plates 22, 24, and prescribed gaps CL are formed between the inner circumference portions of the substrate accommodating portions 22a, 24a and the end faces in the circumferential direction of the recording medium substrate 28'.

The sample substrate chuck 26, while gripping the recording medium substrate 28', is inserted into the substrate accommodating chamber 20A of the substrate holder 20, described below, in a state in which the plates 22 and 24 are in proximity, and is fixed in place by a locking mechanism (not shown).

The substrate holder 20 is provided on one end of the substrate holder base 36 supported by the inner circumference portion of the housing 14H. The substrate holder 20 has a substrate accommodating chamber 20A which is substantially parallel to one end face, which is perpendicular to the axis of rotation. By this means, the sample substrate chuck 26 and recording medium substrate 28' fixed in the substrate accommodating chamber 20A are positioned substantially parallel to one end face of the substrate holder 20.

Figure 1:
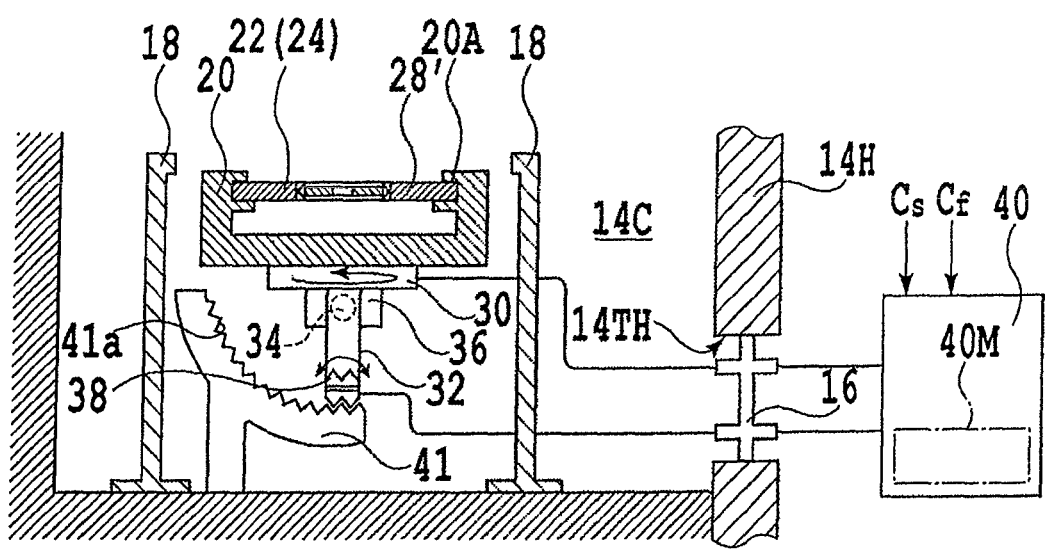
FIG. 1 is a schematic diagram of principal portions of a film deposition apparatus where one example of a method for depositing a thin film for a magnetic recording medium of this invention is applied.

As shown in FIG. 1, the substrate holder 20 comprises a holder rotation mechanism portion, described below, and a tilt mechanism portion. The holder rotation mechanism portion comprises a rotating stage 30 for supporting the substrate holder 20 to enable rotation in the direction indicated by the arrow in FIG. 1. The rotating stage 30 is rotatably supported by the substrate holder base 36. The rotating stage 30 is driven and controlled by a driving motor with braking mechanism, via a gear transmission mechanism (not shown). Rotation control of this driving motor is controlled by a control unit 40, described below.

The tilt mechanism portion comprises a pinion gear support member 32 rotatably connected to the support portion 34 of the rotating stage 30 in the substrate holder base 36, and a gear plate 41 having a rack 41a which meshes with a pinion gear 38 rotatably provided on one end of the pinion gear support member 32.

The pinion gear 38 is connected to the output shaft of a driving motor (not shown). The driving motor is controlled by the control unit 40, described below. By this means, when the driving motor is in the operating state, the pinion gear 38 is rotated in one direction, and is moved along the rack 41a of the gear plate 41, so that the pinion gear support member 32 is rotated to a prescribed angle while inclined about the support portion 34 at a prescribed speed relative to the substrate holder base 36, accompanied by the rotating stage 30. On the other hand, when the pinion gear 38 is rotated in the other direction, the pinion gear support member 32 is returned to the initial position.

Because particles move in the direction of vacuum evacuation, it is preferable that the substrate holder 20 not be positioned between the particle generation position and the exhaust opening 14a.

On the periphery of the substrate holder 20 is provided a cover member 18 so as to enclose the entirety of the substrate holder 20, holder rotation mechanism portion, and tilt mechanism portion, in order to suppress adhesion of suspended carbon particles. One end of the cover member 18 is fixed to the inner periphery of the housing 14H. Because it is preferable that the cover member 18 be formed from material which does not cause deformation or alteration due to the temperatures occurring during film deposition, as the parent material, for example, stainless steel is used.

In order to secure adhesion with the protective layer and prevent early separation, it is preferable that the surface of the cover member 18 be made rough, or that the surface of the cover member 18 be subjected to alumina spraying or other surface treatment. It is preferable that all moveable portions of the stage on which the protective layer is to be deposited be covered, and that the shape of the cover member 18 be cylindrical or another simple shape. This is in order to enable simply and prompt cleaning of the cover member 18.

Further, it is preferable that the position in front of the substrate holder 20 be a position in which the cover member 18 does not exist, so that even if film adhering to the cover member 18 separates, the separated film does not reach the substrate film deposition surface.

In addition to the above configuration, in one example of a film deposition apparatus of this invention, a control unit 40 which drives and controls the above-described holder rotation mechanism portion and tilt mechanism portion is comprised. The control unit 40 is electrically connected via a wiring harness to the above-described holder rotation mechanism portion and tilt mechanism portion. One end of the wiring harness is introduced into the film deposition chamber 14C from outside via a hermetic seal 16 provided in an opening portion 14TH of the housing 14H.

The control unit 40 comprises a data storage portion 40M for storing control data. The data storage portion 40M stores data representing the times to film deposition completion required to form protective layers of different prescribed thicknesses for one recording medium substrate 28'; data representing the minimum inclination angle in the film deposition initial stage, the movement speed of the pinion gear support member 32 in the tilt mechanism portion, and the maximum inclination angle; and data representing the number of rotations per film deposition completion time of the substrate holder 20. The inclination angle θ is the angle made by the rotation axis of the substrate holder 20 with the plane orthogonal to the direction of incidence of the plasma beam Io in FIG. 2.

Further, a film deposition start instruction signal Cs and film deposition end instruction signal Cf are supplied to the control unit 40 from a host computer, not shown.

In the film deposition chamber 14C, when forming a protective layer of prescribed film thickness on the magnetic layer 28Lc of the recording medium substrate 28' in the sample substrate chuck 26 mounted on the substrate holder 20, in a state in which the plasma beam Io arrives at the film deposition chamber 14C, firstly, the control unit 40 reads film deposition completion time data corresponding to the prescribed film thickness of the protective layer, set in advance based on the film deposition start instruction signal Cs, and secondly, referencing this data, sets the above-described film deposition initial-stage minimum inclination angle, maximum inclination angle, speed of movement of the pinion gear support member 32, and the number of rotations per film deposition completion time of the substrate holder 20. The minimum inclination angle is set to a comparatively small angle in the range, for example, greater than 0° and less than 10°, according to the film thickness of the protective layer in the film deposition initial stage. The maximum inclination angle θ is set to 80° according to the film thickness of the protective layer in the latter stage of film deposition and when film deposition ends. The film deposition completion time is, for example, set to approximately one minute. However, the maximum inclination angle is not limited to 80°.

The number of rotations per film deposition completion time of the substrate holder 20 is, for example, set to 3 rotations. The number of rotations is not limited to this example, and may be a value exceeding 3 rotations, up to 6 rotations.

Next, the control unit 40 forms a driving and control signal based on the previously set data representing the minimum inclination angle, maximum inclination angle, and movement speed of the pinion gear support member 32, and supplies the signal to the driving motor in the tilt mechanism portion. Further, the control unit 40 forms a driving and control signal based on the previously set data representing the number of rotations per film deposition completion time of the substrate holder 20, and supplies the signal to the driving motor in the holder rotation mechanism portion.

By this means, the inclination angle θ of the recording medium substrate 28' in the sample substrate chuck 26 mounted on the substrate holder 20 is gradually and continuously increased with the passage of time, from a comparatively small angle to approximately 80°. That is, the substrate holder 20, while rotating about the center axis, rotates such that the angle made by the direction of incidence of the plasma beam Io with the surface of the magnetic layer of the recording medium substrate 28' gradually decreases. At the time of film deposition completion, the film thickness of the protective layer 28Ld reaches, for example, approximately 3 nm. Consequently, the magnetic recording medium 28 is obtained.

Next, when the film deposition end instruction signal Cf is supplied, the control unit 40 forms a driving and control signal so as to return the substrate holder 20 to the initial position, and supplies this signal to the driving motor in the tilt mechanism portion. Also, the control unit 40 halts the supply of the driving and control signal to the driving motor in the holder rotation mechanism portion.

Hence in the film deposition initial stage, it is preferable that film deposition be performed at a comparatively small angle for the initial layer of the protective layer; incidence of the plasma beam Io (ion beam) with the inclination angle θ in a range of comparatively small angles results in little damage to the magnetic layer. Thereafter, by moving the inclination angle θ to a range of comparatively large angles, film deposition can be performed while enhancing the step coverage.

At this time, although damage gradually increases, the protective layer is deposited, so that damage to the magnetic layer is alleviated. As a result, there is little damage to the magnetic layer, and a protective layer with good step coverage can be deposited.

In this way, by continuously changing the inclination angle θ appropriately corresponding to the film thickness of the protective layer, both improved step coverage and reduction of damage to the magnetic layer can be achieved.

Evaluations of protective layers 28Ld of the magnetic recording medium 28 obtained using the above-described film deposition apparatus 10, relating to coverage, coercive force (Hc) as a magnetic characteristic of the magnetic layer, friction force, and number of GH errors, performed by the inventors of the present application, are shown in FIG. 8.

As indicated in FIG. 7, evaluations are for a magnetic recording medium 28 obtained with the number of rotations per film deposition completion time of the substrate holder 20 set to 3 rotations (Embodiment 1) and to 6 rotations (Embodiment 2). The samples of Embodiment 1 and Embodiment 2, and the samples of Comparative Examples 1 through 7 described below, parameters and results for which appear in FIGS. 7 and 8, are all obtained with only the film deposition conditions for the protective layer 28Ld modified. Here, the film thickness of the protective layer 28Ld is constantly 3 nm.

As the method for evaluating coverage of the protective layer 28Ld of the magnetic recording medium 28, a micropipette is used to drip 1 ml of 3% acetic acid onto four prescribed places on the surface of the protective layer 28Ld of the magnetic recording medium, and the sample is then left for 60 minutes. Thereafter the penetrating liquid is recovered using a pipette, and ICP-MS (Agilent Technologies model Agilent 7500a) is used to measure the quantity of penetrating liquid per unit area.

The averages of the values at these four points are indicated in FIG. 8. As a criterion for evaluating protective layer coverage, a quantity per unit area of 0.7 μg/m² or less is preferable, and the item is judged to be satisfactory. As is clear from FIG. 8, in coverage evaluations the protective layers obtained in Embodiments 1 and 2 of this invention are satisfactory.

Evaluation of the friction force (gf) is performed by a pin-on test (drag test) method, in which an AlTiC ($Al_2O_3$—TiC) sphere with a diameter of 2 mm is dragged over the surface of the protective layer 28Ld of the magnetic recording medium. In this test, the friction force is detected using a strain sensor. Sliding test conditions are set so that the rotation rate of the magnetic recording medium, testing radial position, and slider load are respectively 700 rpm, 25 mm, and 2.5 gf.

As the criterion for judgment of the friction force, a friction force of 0.6 gf or less is preferable, and is satisfactory.

As is clear from FIG. 8, the protective layers obtained from Embodiments 1 and 2 of the invention are satisfactory in evaluations of the friction force (gf).

The magnetic characteristics of magnetic layers are evaluated using Hc (coercivity) (Oe). Hc (coercivity) (Oe) is measured using a prescribed VSM (Vibrating Sample Magnetometer) (manufacturer: Toei Kogyo, model VSM-P7-20).

The magnetic layer 28Lc formed is a magnetic film having a value of approximately 3250 (Oe) when fabricated under normal conditions. Larger deviations from this value indicate larger amounts of damage to the magnetic film. Hence, in these measurements, values close to 3250 (Oe) are preferable, and are satisfactory.

As is clear from FIG. 8, the magnetic layers 28Lc obtained from Embodiments 1 and 2 of the invention are satisfactory in evaluations of the magnetic characteristics of the magnetic layer.

With respect to the number of GH errors, evaluations are performed using GH (Glide Height) tests.

GH tests are performed using a hard disk media test system (DS3400-2) manufactured by Sony Tektronix; the head flying height is set to 5 nm, the measurement range is radial positions from 20 to 45 mm, and the pitch is set to 50 µm. 25 samples are acquired for each of Embodiments 1 and 2 under one set of conditions, and similar tests are performed for all samples; the average values are taken to be the number of GH errors for those conditions.

As the criterion for evaluation of the number of GH errors, it is preferable that the number of errors per surface of a magnetic recording medium be 5 or fewer, and such medium is satisfactory.

As is clear from FIG. 8, the magnetic recording medium obtained from Embodiments 1 and 2 of the invention are satisfactory in evaluations of the number of GH errors.

Hence as is clear from the above results, under conditions in which the inclination angle $\theta$ is modified from 0° to 80° during film deposition and moreover the number of rotations of the substrate holder is 3 or greater in Embodiment 1 and Embodiment 2, compared with the conventional CVD method of Comparative Example 7 described below, results are obtained indicating that the friction force (gf) is ⅓ or lower, and that coverage is equivalent or is superior. With respect to coverage, by rotating the substrate holder 6 times, the elution amount is half of the amount when there are only three rotations.

Further, the magnetic recording medium obtained in Comparative Examples 1 through 7 are each evaluated by this inventors, using conditions and equipment similar to those described above, with respect to coverage, coercivity (Hc) as a magnetic characteristic of the magnetic layer, friction force, and number of GH errors.

In Comparative Example 5, during film deposition the inclination angle $\theta$ of the substrate holder 20 is periodically fixed twice for certain periods, at 0° and at 80°, respectively.

Figure 6:
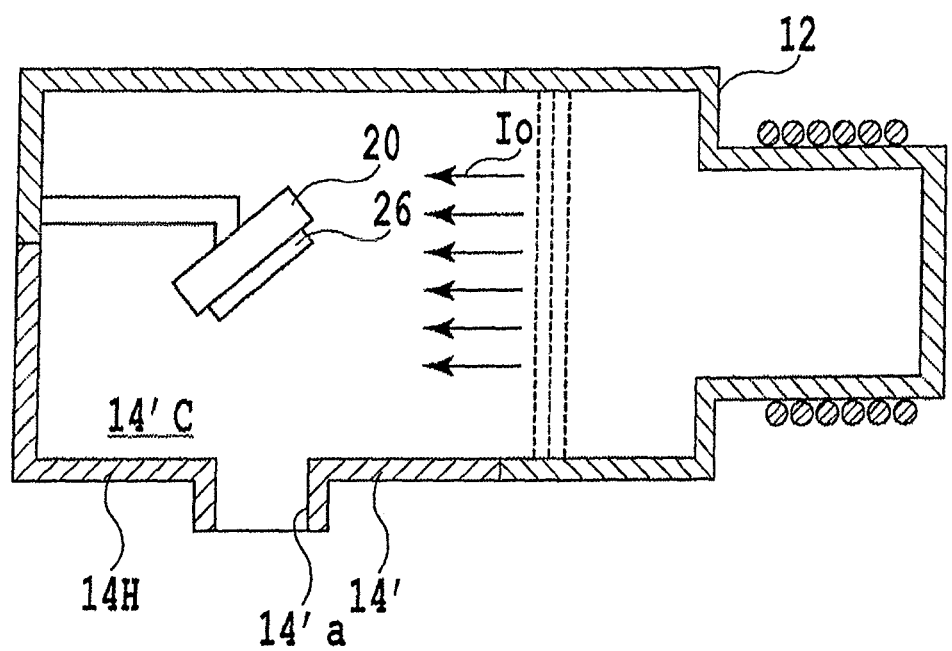
FIG. 6 is a schematic diagram showing the configuration of the film deposition apparatus used in a comparative example.

Further, in Comparative Example 6, a protective layer is fabricated for a magnetic recording medium using the film deposition apparatus shown in FIG. 6. The film deposition apparatus shown in FIG. 6 has an exhaust opening 14'a connected to a vacuum pump as evacuation means (not shown), and provided closer to the plasma beam formation portion 12 than the position of the exhaust opening 14a in the film deposition apparatus shown in FIG. 2, and at a position directly below the substrate holder 20 within the film deposition chamber 14'C in the housing 14'H, that is, on a side wall of the housing 14'H along the direction of incidence of the plasma beam Io. Also, on the periphery of the substrate holder 20, no member equivalent to the cover member 18 in the film deposition apparatus 10 of FIG. 2 is provided. In FIG. 6, the same constituent components as in the example of FIG. 2 are assigned the same symbols, and redundant explanations are omitted.

In Comparative Example 7, a magnetic recording medium is fabricated using a plasma CVD apparatus (not shown). In the plasma CVD apparatus, the raw material gas is ethylene, and the raw material gas flow rate is set to 30 sccm. The film deposition time is adjusted so that the protective layer (carbon film) thickness is 3 nm. At this time, a bias potential of −100 V is applied to the recording medium substrate.

As is clear from FIG. 8, in Comparative Examples 1 through 4, under conditions in which the inclination angle $\theta$ is not changed and the number of rotations is 3 or fewer (Comparative Examples 2, 3, 4), or, the inclination angle $\theta$ is changed up to the maximum inclination angle of 80° and the number of rotations is one (Comparative Example 1), evaluation results are obtained indicating that the coverage becomes dramatically worse.

In Comparative Example 5, a protective layer is fabricated with the inclination angle $\theta$ changed periodically between 0° and the maximum inclination angle of 80° and with the number of rotations being 3. In Comparative Example 5, the result for the magnetic characteristics (coercivity Hc) is prominently worsened, and moreover a tendency toward numerous protrusions with which the head flying over the recording medium collides (a large number of GH errors) is found. In Comparative Example 5, it is observed that if the initial layer in the protective layer is not deposited at a comparatively small angle, the magnetic characteristics are degraded due to increased damage to the magnetic layer, and moreover there is a tendency for particles (carbon particles) to be generated when the inclination angle $\theta$ is varied periodically.

And, in evaluations of protrusions which with the recording head flying over the medium collides (the number of GH errors), the number is fewer than 5 per surface in Embodiment 1, Embodiment 2, and Comparative Example 7, but there is a tendency toward rapid increase in the number of GH errors for Comparative Example 6.

From the above results, an FCVA film deposition procedure can be used in film deposition, continuously changing the inclination angle $\theta$ according to the film thickness (from 0 to 80°), and rotating the substrate holder and recording medium substrate three or more times during the film deposition time, to greatly reduce the wear amount and achieve equivalent or improved coverage. Further, by installing a moveable substrate holder (moveable portion) in vacuum in the film deposition chamber 14C, it is found that the number of particles (carbon particles) generated can be made equal to that of the prior art by appropriately placing the vacuum evacuation equipment and installing a cover member.

Figure 5:
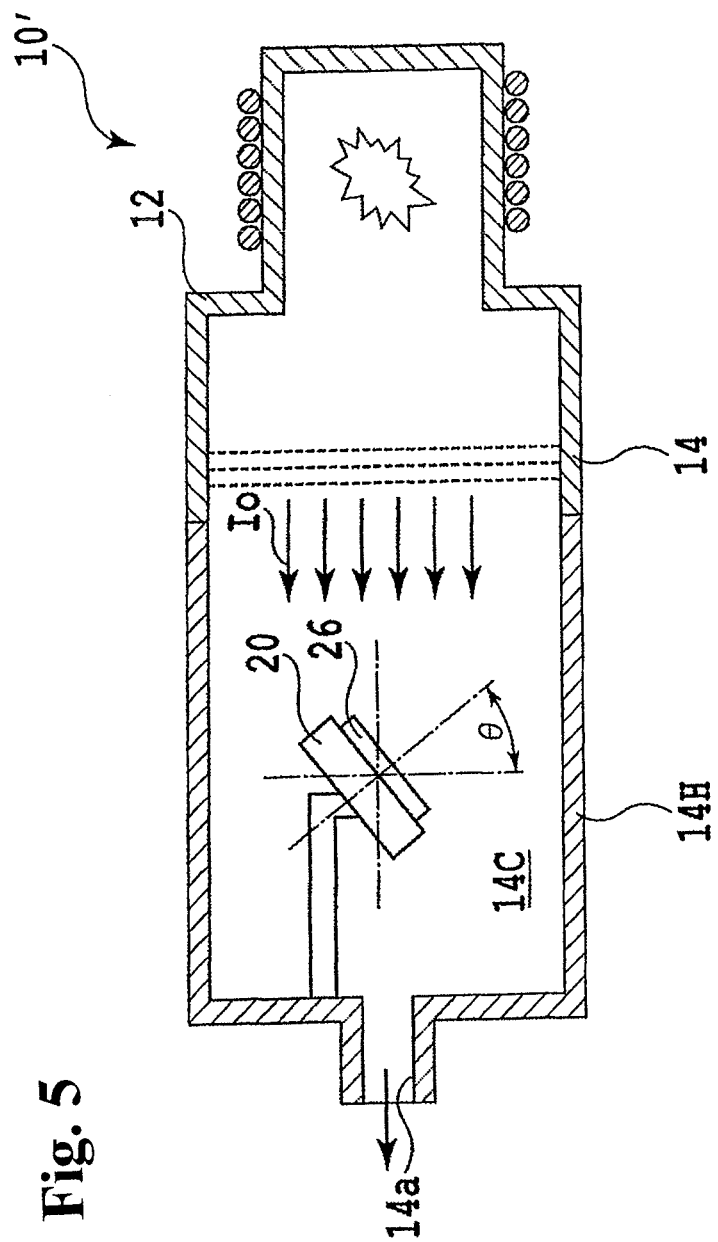
FIG. 5 is a diagram showing the configuration of another example of the film deposition apparatus where one example of the method for depositing the thin film for the magnetic recording medium of this invention is applied.

In the above-described examples of film deposition apparatuses of this invention, a cover member 18 is provided; but the configuration is not limited to these examples, and for example a film deposition apparatus 10' in which no cover member 18 is provided, such as shown in FIG. 5, may be used. In FIG. 5, the same constituent elements as in the example of FIG. 2 are assigned the same symbols, and redundant explanations are omitted.

The disclosure of Japanese Patent Application No. 2008-132245 filed on May 20, 2008 is incorporated as a reference.

While the invention has been explained with reference to the specific embodiments of the invention, the explanation is illustrative and the invention is limited only by the appended claims.

What is claimed is:

1. An apparatus for depositing a tetrahedral amorphous carbon thin film for a magnetic recording medium, comprising:
- a film deposition chamber;
- a plasma beam formation portion connected to the film deposition chamber for supplying a plasma beam to the film deposition chamber to form the tetrahedral amorphous carbon thin film on a substrate with a magnetic recording layer thereon;
- a substrate holder rotatably arranged in the film deposition chamber for removably holding the substrate;
- a tilting member for continuously changing an inclination angle formed by a normal line to a surface of the magnetic recording layer of the substrate and a plane orthogonal to a direction of incidence of the plasma beam;
- a rotating member for rotating the substrate about a rotation axis of the substrate holder; and
- a control member for rotating the substrate holder with the substrate thereon and operating the tilting member to continuously change the inclination angle from a minimum inclination angle to a maximum inclination angle according to an increase in film thickness of the tetrahedral amorphous carbon thin film being formed by the plasma beam formation portion,
- wherein the minimum inclination angle is more than 0° and less than 10°, and the maximum inclination angle is less than 80°.

2. An apparatus for depositing a tetrahedral amorphous carbon thin film for a magnetic recording medium according to claim 1, further comprising a cover member provided in the film deposition chamber for enclosing the substrate holder, the tilting member, and the rotating member.

3. An apparatus for depositing a tetrahedral amorphous carbon thin film for a magnetic recording medium according to claim 1, further comprising an exhaust opening provided in the film deposition chamber at a position in an end portion opposite to the plasma beam formation portion, and evacuation means connected to the exhaust opening for evacuating the film deposition chamber so as to have a negative pressure therein.

4. An apparatus for depositing a tetrahedral amorphous carbon thin film for a magnetic recording medium according to claim 2, wherein the cover member has a cylindrical shape.

* * * * *